United States Patent [19]

Colburn et al.

[11] Patent Number: 5,635,775

[45] Date of Patent: Jun. 3, 1997

[54] PRINTED CIRCUIT BOARD MOUNT ELECTRO-MAGNETIC INTERFERENCE SUPPRESSOR

[76] Inventors: Richard H. Colburn, 28341 Nicholas Cir., Saugus, Calif. 91350; Donald F. Hosmer, 75147 LaCresta Dr., Palm Desert, Calif. 92211

[21] Appl. No.: 422,058

[22] Filed: Apr. 14, 1995

[51] Int. Cl.$^6$ .................................................. H05K 9/00
[52] U.S. Cl. ........................... 307/91; 333/182; 361/816; 361/818
[58] Field of Search ........................ 307/91, 89; 361/302, 361/328–330, 816, 818, 785, 766, 782, 811, 212, 220; 333/181–185; 439/620, 607–609

[56] References Cited

U.S. PATENT DOCUMENTS

| | | | |
|---|---|---|---|
| 3,426,257 | 2/1969 | Youngquist | 361/302 |
| 3,808,478 | 4/1974 | Winkler | 361/302 |
| 4,070,084 | 1/1978 | Hutchinson | 439/608 |
| 4,144,509 | 3/1979 | Boutros | 333/181 |
| 4,262,268 | 4/1981 | Shimada et al. | 333/182 |
| 4,484,159 | 11/1984 | Whitley | 333/182 |
| 4,514,782 | 4/1985 | Sakamoto et al. | 361/302 |
| 4,571,014 | 2/1986 | Robin et al. | 439/608 |
| 4,853,659 | 8/1989 | Kling | 333/184 |
| 4,874,319 | 10/1989 | Hasircoglu | 439/608 |
| 4,931,754 | 6/1990 | Moussie | 333/184 |
| 4,999,595 | 3/1991 | Azumi et al. | 333/184 |
| 5,039,965 | 8/1991 | Higgins, Jr. | 333/182 |
| 5,150,086 | 9/1992 | Ito | 333/182 |
| 5,153,540 | 10/1992 | Gliha, Jr. | 333/182 |
| 5,221,216 | 6/1993 | Gabany et al. | 333/185 |
| 5,263,870 | 11/1993 | Billman et al. | 439/608 |
| 5,280,257 | 1/1994 | Cravens et al. | 333/182 |
| 5,497,129 | 3/1996 | Mantese et al. | 333/182 |

*Primary Examiner*—Richard T. Elms
*Attorney, Agent, or Firm*—Kelly, Bauersfeld, Lowry & Kelley

[57] ABSTRACT

An electro-magnetic interference suppressor includes a segmented array of ceramic feed-through capacitors, and a conductive fence which is attached to the capacitor array about its periphery. The fence is attached to a ground of a printed circuit board such that a generally planar surface of the segmented array lies adjacent to a planar surface of the printed circuit board. The suppressor provides an effective filter for eliminating unwanted noise occurring in electronic circuitry. The fence, in one embodiment, is surface mounted and soldered to a surface ground pad of the printed circuit board. In another embodiment, the fence includes a ground pin which extends into printed circuit board for contact with the circuit board ground. The ground pin may be soldered in place or may include a compliant section for press-fit reception within a through-hole. Conductive pins extend through respective ones of the feed-through capacitors, and in one embodiment ends of these pins abut a surface circuit pad of the printed circuit board. In other embodiments the ends of the conductive pins extend into receiving apertures in the circuit board where they are either press-fit or soldered in place.

20 Claims, 1 Drawing Sheet

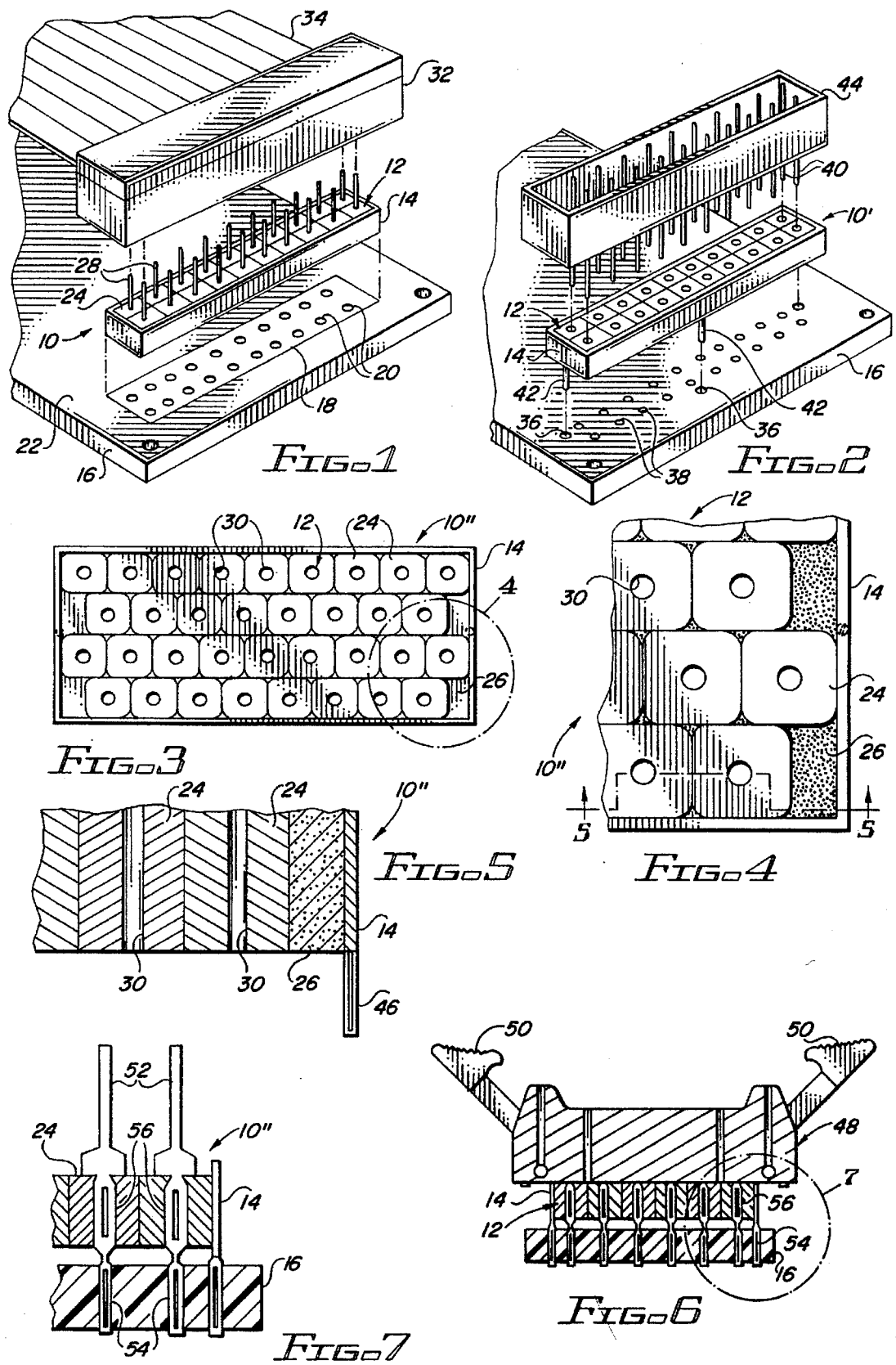

PRINTED CIRCUIT BOARD MOUNT ELECTRO-MAGNETIC INTERFERENCE SUPPRESSOR

BACKGROUND OF THE INVENTION

This invention relates generally to filters suitable for eliminating unwanted noise occurring in electronic circuitry. More particularly, the present invention relates to a stand alone electro-magnetic interference filter which is mountable to a surface of a printed circuit board.

The operation of computers and other electronic devices is usually accompanied by unwanted noise generated in the same device or transmitted from another apparatus. As computing speeds increase, the demands and design requirements for printed circuit boards are becoming increasingly complex. The components on the printed circuit boards are becoming more sensitive to electro-magnetic interference and electrostatic discharge, both of which conditions are very undesirable and can interfere with proper operation of the printed circuit board.

One reason that electro-magnetic interference and electrostatic discharge are becoming problems in the operation of modern printed circuit boards is that the trend is to make the equipment, including the circuit board, smaller, thus putting radiating components in closer proximity to one another. Additionally, the explosion of wireless technology tends to jam the frequency spectrum. These factors, with others, points to a dramatic increase in electro-magnetic interference suppression requirements on equipment in many major electronics markets.

Filtered connectors, currently used in commercial and military applications, are standard connector configurations which have been modified to incorporate capacitors and/or inductive devices to accomplish electro-magnetic interference filtering. This is very costly and makes the connector a special order, custom product. Previously, in order to add a filtered connector in line between electronic components, an increase in case size, additional available space and special pins have often been required.

In general, electro-magnetic interference feed-through filtering capacitors have been provided primarily in connectors attaching various components to the outside case wall of the equipment. The purpose of these filtering connectors is to shunt unwanted noise to ground through the connector shell and ultimately to ground via the equipment housing. However, many connectors now used are non-metallic, and consequently there is no easy manner in which to shunt the noise through the connector shell to ground. Another problem encountered with existing technology is that typically only connector manufacturers have supplied filtered connectors. This has tied the OEM customer exclusively to one source and to one type of connector configuration.

Accordingly, there has been a need for a novel electro-magnetic interference suppressor which is adaptable to a number of different types of connector designs and configurations. Preferably such a suppressor should mount directly to the ground on the printed circuit board, providing the filter at the source of the electro-magnetic interference problem. Moreover, there is a need for an electro-magnetic interference suppressor that can also be utilized as an electrostatic discharge protection device when combined with other surface or printed circuit board mounted components. The improved suppressor/filter should be of simple construction and adaptable for use with different types of printed circuit boards and different types of connector leads. The present invention fulfills these needs and provides other related advantages.

SUMMARY OF THE INVENTION

The present invention resides in an improved electro-magnetic interference suppressor, which provides an interface between a printed circuit board and a non-metallic interconnect device mountable onto the printed circuit board, which is economical to produce and effectively overcomes the aforementioned drawbacks with prior art electronic filters. The electro-magnetic interference suppressor includes a capacitor array, a fence conductively attached about its inner periphery to the array, and means for attaching the fence to a ground of the printed circuit board. When the fence is so grounded, a generally planar surface of the array lies adjacent to the printed circuit board and the fence extends generally perpendicularly thereto. In preferred forms of the invention, the array comprises a plurality of ceramic feed-through capacitors which are conductively bonded together and to an inner periphery of the fence.

In one of several embodiments of the invention, the attaching means comprises a printed circuit board surface ground pad on which an edge of the fence is brought into contact and then conductively adhered in place. Alternatively, the attaching means may comprise a ground pin attached to the fence and which extends into a through-hole of the printed circuit board for contact with a printed circuit board ground. The ground pin is conductively adhered within the through-hole either by soldering it in place, or by proving the ground pin with a compliant section for press-fit reception within the printed circuit board through-hole.

The electro-magnetic interference suppressor may also include central conductors which extend through respective segments of the capacitor array. When the printed circuit board includes a surface circuit pad, the central conductors typically comprise nail-head pins which extend through respective ones of the feed-through capacitors, wherein the nail-head pins have ends which abut the surface circuit pad. Alternatively, when the printed circuit board includes receiving apertures in alignment with the feed-through capacitors, the conductive pins extend through respective ones of the feed-through capacitors and into the receiving apertures, wherein the conductive pins are conductively adhered in place. This may be accomplished by either soldering the conductive pins in place, or by supplying double compliant pins. Such double compliant pins include a first compliant section that press-fits into the respective receiving aperture, and a second compliant section that press-fits into an aperture through the respective feed-through capacitor.

Since the electro-magnetic interference suppressor mounts directly to the ground on the printed circuit board, a high quality filter is provided at a source of the electro-magnetic interference problem. With such filtering being accomplished at the board level, it provides excellent protection from board to board or from one compartment to another. Thus, with filtering and shielding provided at the board level, even very inexpensive and non-conductive edge cards and multi-pin ribbon connectors can be efficiently provided electro-magnetic interference protection.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 1 is a fragmented exploded perspective view of one preferred form of an electro-magnetic interference suppressor embodying the invention, illustrating a surface mount suppressor in alignment over a surface ground pad of a printed circuit board, and a right angle circuit board connector in alignment over the surface mount suppressor;

FIG. 2 is a fragmented exploded perspective view similar to that shown in FIG. 1, illustrating a second preferred form of an electro-magnetic interference suppressor embodying the invention, wherein a through-hole mount suppressor is shown in alignment over a plurality of receiving apertures in the printed circuit board, and a circuit board connector in alignment over the suppressor;

FIG. 3 is a top plan view of a third preferred form of an electro-magnetic interference suppressor embodying the invention;

FIG. 4 is an enlarged fragmented top plan view of the area indicated by the line 4 in FIG. 3;

FIG. 5 is a fragmented sectional view taken generally along the line 5—5 of FIG. 4, illustrating the construction of a press-fit mount suppressor including a segmented capacitor array and a conductive fence conductively attached to the capacitor array about its periphery, and a compliant ground pin;

FIG. 6 is an elevational and partially sectional view of the press-fit mount suppressor of FIGS. 3–5, illustrating use of compliant pins press-fit into both the segmented capacitor array and the printed circuit board, and a press-fit header having ejector latches; and FIG. 7 is an enlarged fragmented sectional view of the area indicated by the line 7 in FIG. 6, further illustrating the fence ground pin which is press-fit into the printed circuit board, and double compliant pins that are press-fit into both the printed circuit board and feed-through capacitors forming the segmented capacitor array.

DETAILED DESCRIPTION OF THE PREFERRED EMBODIMENTS

As shown in the drawings for purposes of illustration, the present invention is concerned with an electro-magnetic interference (EMI) suppressor, generally designated by the reference number 10. The EMI suppressor 10 comprises, generally, a segmented capacitor array 12, a conductive fence 14 which surrounds the array 12, and means for attaching the fence 14 to a ground of a printed circuit board 16. Typically, a generally planar surface of the segmented capacitor array 12 lies adjacent to a planar surface of the printed circuit board 16, and the fence 14 extends generally perpendicularly to the printed circuit board planar surface.

With reference to FIG. 1, the EMI suppressor 10 may be surface mountable to a printed circuit board 16 having a ground trace 18 and active circuit pads 20 located on a generally planar surface 22. In this instance the segmented capacitor array 12 comprises a plurality of ceramic through-hole capacitors 24 that are peripherally surrounded by the fence 14. The capacitors 24 are conductively bonded to one another and to the fence 14 by suitable means such as solder 26 or any other standard conductive adhesive. A nail-head pin 28 extends through a central aperture 30 of each through-hole capacitor 24 and is held in place by solder 26 or the like.

The ground trace 18 provided on the planar surface 22 of the printed circuit board 16 is configured to directly underlie and contact a lower edge of the conductive fence 14. Similarly, the active circuit pads 20 are configured on the upper planar surface 22 of the printed circuit board 16 so as to be in alignment with and contact the lower ends of the nail-head pins 28. Thus, when the surface mount EMI suppressor 10 is soldered in place onto the printed circuit board 16, the nail-head pins 28 conductively contact the active circuit pads 20, and the conductive fence 14 is grounded to a ground of the printed circuit board 16 though the ground trace 18. Portions of the nail-head pins 28 extending upwardly from the segmented capacitor array 12 provide suitable connectors for a standard circuit board connector, such as the non-metallic right angle circuit board connector 32 located at an end of a ribbon cable 34.

FIG. 2 illustrates a through-hole soldered EMI suppressor 10'. The suppressor 10' is typically utilized with printed circuit boards 16 having through-holes 36 to ground, and a plurality of receiving apertures 38 configured to receive conductive pins 40 therein. In discussing the embodiment shown in FIG. 2, as well as the embodiment discussed below and shown in FIGS. 3–7, common elements shall retain the same reference numbers.

Accordingly, the through-hole soldered EMI suppressor 10' comprises a segmented capacitor array 12 of a plurality of ceramic through-hole capacitors 24, surrounded by a conductive fence 14. The fence 14 includes several integral ground pins 42 adapted for insertion into the through-holes 36 of the printed circuit board 16 and into engagement with its ground. Typically these ground pins 42 are soldered in place. As shown in FIG. 2, the EMI suppressor 10' may be advantageously used with a through-hole circuit board connector 44 which includes downwardly projecting ground pins 42 disposed so as to extend through respective ones of the central apertures 30 of the through-hole capacitors 24 and into the aligned receiving apertures 38 of the printed circuit board 16. The conductive pins 40 may also be soldered in place within the receiving apertures 38.

FIGS. 3–7 illustrate another form of the EMI suppressor 10" of the present invention. In this case the segmented capacitor array 12 is formed of the same through-hole capacitors 24 bonded together by a solder 26 (or other conductive adhesive), and surrounded by and conductively adhered to a conductive fence 14. The array 12 of this third embodiment comprises a greater number of individual capacitors 24 whose central apertures 30 are offset relative to those in adjacent rows.

As shown in FIG. 5, the conductive fence 14 is provided a plurality of ground pins 46 which extend downwardly from the segmented capacitor array 12 for reception into through-holes 36 provided in the printed circuit board 16 to conductively place the fence 14 in contact with the ground of the printed circuit board 16. FIG. 6 shows, for illustrative purposes only, a typical header connector 48 including ejector latches 50 placed over the EMI suppressor 10" and into engagement with conductive pins 52 inserted through the capacitor array 12 and into receiving apertures 38 provided in the printed circuit board 16. These conductive pins, in contrast with the pins 40 of the embodiment of FIG. 2 and the nail-head pins 28 of FIG. 1, are not soldered within the central apertures 30 of the through-hole capacitors 24, nor are they soldered within the receiving apertures 38 of the printed circuit board 16. Rather, the conductive pins 52 are double complaint pins designed to be press-fit through the capacitors 24 and into the printed circuit board 16 in a manner which simplifies assembly and use of the EMI suppressor 10".

More particularly, as illustrated best in FIG. 7, the double compliant pins 52 include a first compliant section 54 adapted for press-fit reception within a respective receiving aperture 38 of the printed circuit board 16. Each conductive pin 52 also includes a second compliant section 56 adapted for press-fit reception within the central aperture 30 of a respective through-hole capacitor 24. Similarly, the compliant ground pins 46 are adapted for press-fit reception within the printed circuit board through-holes 36. This particular design of EMI suppressor 10" permits the segmented array 12 and conductive fence 14 assembly to be press-fit onto the printed circuit board 16 in a manner grounding the fence, and then permitting double compliant pins 52 to be press-fit into the aligned capacitor central apertures 30 and the printed circuit board receiving apertures 38.

From the foregoing it will be understood that the EMI suppressors 10-10" provide a feed-through filter that may be either surface, press-fit or through-hole mounted on the printed circuit board 16. The ceramic capacitor array allows electrical connectors, in the form of conductive pins 28, 40 or 52 to be soldered or press-fit into the array 12 and soldered or press-fit into the printed circuit board 16. The EMI suppressors may be assembled as multi-circuit filters by installing additional materials/components such as ferrite elements for inductive purposes or components such as MOVs, transorbs or additional capacitor elements into the ground fence. Straight feed-through capacitors, Pi-section, L-section and T-section filters as well as other circuits are available to meet special applications and may be fully utilized in connection with the EMI suppressors.

The EMI suppressors are grounded directly to the printed circuit board 16, either by mounting the fence 14 directly to a ground trace 18, or by through-hole 36 mounting wherein the ground pins 42 and 46 are either soldered or press-fit in place. The EMI suppressors further provide an extremely low impedance path to ground, and the suppressors' close proximity to the source of the electro-magnetic interference in the board circuitry decreases the chance of the radiated or conducted electro-magnetic interference from propagating from the noise source to other parts of the system and its circuitry. Further, the EMI suppressor may be utilized in conjunction with other metallic shields on opposing sides of the printed circuit board 16 in order to provide effective shielding at very high frequencies.

Advantageously, the EMI suppressors eliminate the problem of capacitance coupling, and utilize the same footprint on the printed circuit board as typical input connectors. This saves valuable board space as well as additional space required behind a conventional filtered connector. Moreover, the EMI suppressors of the present invention provide some reduction of electrostatic discharge (ESD) from each circuit with a feed-through capacitor to ground. The EMI suppressors can be utilized as stand alone devices or mounted on the connector prior to assembly, and may further be utilized with either a non-conductive (plastic) shelled connector or the standard metallic connector.

Although several embodiments of the present invention have been described in detail for purposes of illustration, various modifications may be made without departing from the spirit and scope of the invention. Accordingly, the invention is not to be limited, except as by the appended claims.

We claim:

1. An electro-magnetic interference (EMI) suppressor providing an interface between a printed circuit board and a non-metallic interconnect device mountable onto the printed circuit board, the EMI suppressor comprising:

a plurality of ceramic feed-through capacitors conductively bonded together to form a segmented capacitor array;

a conductive fence surrounding the periphery of the segmented capacitor array;

means for conductively bonding the periphery of the segmented capacitor array to an inner periphery of the fence;

central conductors extending through respective feed-through capacitors of the segmented capacitor array; and means for attaching the fence to a ground of the printed circuit board, wherein, when the fence is grounded to the printed circuit board, a generally planar surface of the capacitor array lies adjacent to a planar surface of the printed circuit board, and the fence extends generally perpendicularly to the printed circuit board planar surface.

2. The electro-magnetic interference suppressor of claim 1, wherein the attaching means comprises a printed circuit board surface ground pad on which an edge of the fence is brought into contact and then conductively adhered in place.

3. The electro-magnetic interference suppressor of claim 2, wherein the central conductors comprise nail-head pins extending through respective ones of the feed-through capacitors, and having an end abutting a surface circuit pad of the printed circuit board.

4. The electro-magnetic interference suppressor of claim 1, wherein the attaching means comprises a ground pin attached to the fence and which extends into a through-hole of the printed circuit board for contact with a printed circuit board ground.

5. The electro-magnetic interference suppressor of claim 4, including means for conductively adhering the ground pin in place within the through-hole.

6. The electro-magnetic interference suppressor of claim 5, wherein the central conductors comprise conductive pins extending through respective ones of the feed-through capacitors and into receiving apertures in the printed circuit board, and means for conductively adhering the conductive pins within the receiving apertures.

7. The electro-magnetic interference suppressor of claim 4, wherein the central conductors comprise double compliant pins extending through respective ones of the feed-through capacitors and into receiving apertures in the printed circuit board.

8. The electro-magnetic interference suppressor of claim 7, wherein the double compliant pins include a first compliant section that press-fits into the respective receiving aperture, and a second compliant section that press-fits into an aperture through the respective feed-through capacitor.

9. The electro-magnetic interference suppressor of claim 8, wherein the ground pin includes a compliant section for press-fit reception within the printed circuit board through-hole.

10. An electro-magnetic interference (EMI) suppressor providing an interface between a printed circuit board and a non-metallic interconnect device mountable onto the printed circuit board, the EMI suppressor comprising:

a plurality of ceramic feed-through capacitors conductively bonded together to form a segmented capacitor array;

a conductive fence surrounding the periphery of the segmented capacitor array;

means for conductively bonding the periphery of the segmented capacitor array to an inner periphery of the fence; and means for attaching the fence to a ground of the printed circuit board, wherein, when the fence is so grounded, a lower surface of the array lies adjacent to the printed circuit board and the fence extends generally perpendicularly thereto.

11. The electro-magnetic interference suppressor of claim 10, wherein the attaching means comprises a printed circuit board surface ground pad on which an edge of the fence is brought into contact and then conductively adhered in place.

12. The electro-magnetic interference suppressor of claim 11, including nail-head pins extending through respective ones of the feed-through capacitors and having an end abutting a surface circuit pad of the printed circuit board.

13. The electro-magnetic interference suppressor of claim 10, wherein the attaching means comprises a ground pin attached to the fence and which extends into a through-hole of the printed circuit board for contact with a printed circuit board ground.

14. The electro-magnetic interference suppressor of claim 13, including conductive pins extending through respective ones of the feed-through capacitors and into receiving apertures in the printed circuit board, and means for conductively adhering the ground pin and the conductive pins within the printed circuit board.

15. The electro-magnetic interference suppressor of claim 10, including double compliant pins extending through respective ones of the feed-through capacitors and into receiving apertures in the printed circuit board, wherein the double compliant pins include a first compliant section that press-fits into the respective receiving aperture, and a second compliant section that press-fits into an aperture through the respective feed-through capacitor.

16. The electro-magnetic interference suppressor of claim 15, wherein the attaching means comprises a ground pin attached to the fence and having a compliant section for press-fit reception within a through-hole of the printed circuit board for contact with a printed circuit board ground.

17. An electro-magnetic interference (EMI) suppressor providing an interface between a printed circuit board and a non-metallic interconnect device mountable onto the printed circuit board, the EMI suppressor comprising:

a feed-through capacitive device;

a conductive fence surrounding the periphery of the capacitive device;

means for conductively bonding the periphery of the capacitive device to an inner periphery of the fence; and means for attaching the fence to a ground of the printed circuit board, wherein, when the fence is so grounded, a lower surface of the capacitive device lies adjacent to the printed circuit board and the fence extends generally perpendicularly thereto.

18. The electro-magnetic interference suppressor of claim 17, wherein the attaching means comprises a printed circuit board surface ground pad on which an edge of the fence is brought into contact and then conductively adhered in place, and wherein the EMI suppressor includes nail-head pins extending through the feed-through capacitive device, each having an end abutting a surface circuit pad of the printed circuit board.

19. The electro-magnetic interference suppressor of claim 17, wherein the attaching means comprises a ground pin attached to the fence and which extends into a through-hole of the printed circuit board for contact with a printed circuit board ground, and wherein the EMI suppressor includes conductive pins extending through the feed-through capacitive device and into receiving apertures in the printed circuit board, and means for conductively adhering the ground pin and the conductive pins within the printed circuit board.

20. The electro-magnetic interference suppressor of claim 17, including double compliant pins extending through the feed-through capacitive device and into receiving apertures in the printed circuit board, wherein the double compliant pins include a first compliant section that press-fits into the respective receiving aperture, and a second compliant section that press-fits into an aperture through the feed-through capacitive device, and wherein the attaching means comprises a ground pin attached to the fence and having a compliant section for press-fit reception within a through-hole of the printed circuit board for contact with a printed circuit board ground.

* * * * *